(12) United States Patent
Park et al.

(10) Patent No.: US 7,436,257 B2
(45) Date of Patent: Oct. 14, 2008

(54) HIGH-EFFICIENCY MIXED-MODE POWER AMPLIFIER

(75) Inventors: Min Park, Daejeon (KR); Yun Ho Choi, Daejeon (KR); Kyung Hwan Park, Daejeon (KR); Seok Bong Hyun, Daejeon (KR); Seong Su Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 112 days.

(21) Appl. No.: 11/482,576

(22) Filed: Jul. 7, 2006

(65) Prior Publication Data

US 2007/0085602 A1   Apr. 19, 2007

(30) Foreign Application Priority Data

Oct. 17, 2005   (KR) ...................... 10-2005-0097449

(51) Int. Cl.
H03F 1/14   (2006.01)
(52) U.S. Cl. ........................... 330/51; 330/302; 330/310
(58) Field of Classification Search .................. 330/51, 330/124 R, 295, 302, 310
See application file for complete search history.

(56) References Cited

U.S. PATENT DOCUMENTS

| | | | |
|---|---|---|---|
| 5,438,684 A | 8/1995 | Schwent et al. | |
| 5,872,481 A | 2/1999 | Sevic et al. | |
| 6,208,202 B1 | 3/2001 | Kaufman et al. | |
| 6,600,344 B1 | 7/2003 | Newman et al. | |
| 6,700,440 B2 | 3/2004 | Hareyama | |
| 6,781,455 B2 * | 8/2004 | Kim ........................ | 330/124 R |
| 6,900,692 B2 | 5/2005 | Kim et al. | |
| 6,900,697 B1 | 5/2005 | Doyle et al. | |
| 7,157,966 B2 * | 1/2007 | Baree et al. .................. | 330/310 |
| 2003/0222709 A1 | 12/2003 | Kim | |
| 2004/0061555 A1 | 4/2004 | Lynch | |
| 2005/0030094 A1 | 2/2005 | Conrad et al. | |

FOREIGN PATENT DOCUMENTS

| | | |
|---|---|---|
| KR | 10-1997-0014211 | 4/1997 |
| KR | 2000-0018934 | 10/2000 |
| KR | 2003-0093027 | 12/2003 |
| KR | 10-2004-0054276 | 6/2004 |
| KR | 1020040061468 | 7/2004 |
| KR | 10-2005-0017617 | 2/2005 |

* cited by examiner

Primary Examiner—Khanh V Nguyen
(74) Attorney, Agent, or Firm—Blakely, Sokoloff, Taylor & Zafman LLP

(57) ABSTRACT

Provided is a power amplifier of a low-power consumption system that has linearity at a peak output power while increasing efficiency in a most frequently used range, and thereby enables a battery to last longer. The power amplifier includes an input impedance matcher for impedance-matching a signal input from the outside; a high-power amplifier and a low-power amplifier for amplifying the signal having passed through the input impedance matcher; an amplification controller controlling the high-power amplifier and low-power amplifier according to the power level of the input signal; an output impedance matcher for impedance-matching the signal amplified by the high-power amplifier and low-power amplifier; and a dynamic voltage supplier for supplying the low-power amplifier with a variable driving voltage. With the constitution set forth above, linearity at peak output power is maintained, and efficiency increases in the most frequently used range, thereby enabling the battery of a handheld to last longer.

9 Claims, 6 Drawing Sheets

HIGH-EFFICIENCY MIXED-MODE POWER AMPLIFIER

CROSS-REFERENCE TO RELATED APPLICATION

This application claims priority to and the benefit of Korean Patent Application No. 2005-97449, filed Oct. 17, 2005, the disclosure of which is incorporated herein by reference in its entirety.

BACKGROUND

1. Field of the Invention

The present invention relates to a power amplifier, and more particularly, to a power amplifier of a low-power consumption system that has linearity at peak output while increasing efficiency in a most frequently used range, and thus enabling a battery to last longer.

2. Discussion of Related Art

In general, mobile communication terminals, cellular phones, and non-constant envelope systems (for example, code division multiple access (CDMA), wideband-CDMA (W-CDMA), etc.), in which linearity is an important requirement, usually employ class A or class AB power amplifiers.

Considering current technology development trends, future portable terminals would be required to provide not only a conventional voice-oriented service but also various additional services such as voice, Internet, moving picture, electronic signature/measurement/control, and so forth. In order to do so, it is necessary that they are equipped with a complex function and a high transfer rate; however, as such demand for complex function and high transfer rate increases, power consumption has emerged as the most important issue.

Therefore, producing low-power consumption components is necessary for continuously maintaining the international competitiveness of portable terminals and providing various additional services to keep up with the market.

Meanwhile, in a field of technology in which full-scale development is currently underway, core technology on the rise includes chip miniaturization, analog device gain improvement, leakage current prevention, multi-operating voltage and clock gating circuit design, mixed-mode communication, intelligent transmission protocol, and so forth.

Particularly, a power amplifier, which is an indispensable component for transmitting a signal, consumes the most power in a portable mobile communication terminal. Therefore, if a power amplifier circuit used in a mobile communication terminal and a cellular phone is manufactured in such a way that it consumes less power, the result is a low-power consumption system with multiple and complex functions. Such a system can vitalize the mobile communication service industry and provides individuals with many daily activity functions through just one terminal. Furthermore, since multimedia communication using a terminal can proceed for a longer time, restrictions of space and time can be better overcome and the free flow of information throughout society can be enhanced.

FIG. 1 is a schematic block diagram illustrating a conventional power amplifier.

Referring to FIG. 1, the conventional power amplifier comprises a high-power amplification device 1 amplifying an input radio frequency (RF) signal; a mode switch 2 determining consumption currents $I_1$ and $I_2$ of the high-power amplification device 1; and an input impedance matching circuit 3 and an output impedance matching circuit 4 for matching the input and output impedances of the high-power amplification device 1.

Here, a heterojunction bipolar transistor (HBT) array is mainly used for the high-power amplification device 1, which can be a bipolar junction transistor (BJT) array, field effect transistor (FET) array, and so forth.

In general, when an RF output power is less than a direct current (DC) consumption power, a power amplifier shows very low power efficiency. In order to solve this problem, the conventional power amplifier operates in a high-power mode and a low-power mode in which less power is consumed.

In the conventional power amplifier, the consumption currents $I_1$ and $I_2$ in the high-power mode and low-power mode are determined by the mode switch 2, and a supply voltage is determined to be a battery supply voltage (in cellular phones, about 3.4V to 4.2V). Therefore, power consumption is determined by supplied DC current.

When an RF input to the high-power amplification device 1 increases, an RF power output from the device and a consumed DC current both increase. Here, in a high-power mode of about 1W, a voltage swing range for generating the peak output power becomes the battery supply voltage, and a load impedance of about 2 to 5 Ohms is used according to a current swing range.

On the other hand, since the low-power mode has a low output power of about 16 dBm, a high load impedance is used without considerably increasing current consumption, so that an RF voltage swing range becomes similar to a battery supply voltage range. Therefore, power efficiency can be improved.

In addition, in the low-power mode of about 16 dBm, a load impedance at the maximum efficiency is more than about 15 Ohms. Therefore, when the same output impedance is shared between the high-power mode and low-power mode, a consumption current at an operating point is changed by mode switching in both modes, but the peak output power should be satisfied first. Therefore, a load impedance is designed to be appropriate for the high-power mode, so that efficiency in the low-power mode in which an RF input is less than about 16 dBm is hardly more than about 10%.

In addition, when the consumption currents $I_1$ and $I_2$ of the high-power amplification device 1 are further reduced little-by-little, efficiency is improved; however, since plenty of non-linear elements are generated during high-power signal operation, the linearity of the power amplifier is deteriorated.

Consequently, there is a limit to embodying a high-efficiency power amplifier in a low-power consumption system only by changing the consumption currents $I_1$ and $I_2$ while maintaining a high degree of linearity in the high-power and low-power modes.

FIG. 2 is a graph showing Conexant company's use rate function according to output power. When an output power use rate is as shown in FIG. 2, such as in a mobile communication terminal/cellular phone, a power amplifier operating with maximum efficiency at the peak output power has a problem in that a power-added efficiency drops in an area between about −16 dBm and 16 dBm that has a high use rate.

SUMMARY

It is an object of the present invention to provide a power amplifier that is divided into at least two power stages, uses a non-linear amplifier for high efficiency at a low output, uses a high-linearity amplifier for linearity at a high output, and thereby consumes little power.

It is another object of the present invention to provide a power amplifier that has a dynamic voltage supplier to maximize efficiency improvement in a most frequently used area, increases efficiency in the most frequently used area, and thus enables a battery to last longer.

One aspect of the present invention provides a power amplifier comprising an input impedance matcher for impedance-matching a signal input from the outside; a high-power amplifier and a low-power amplifier for amplifying the signal having passed through the input impedance matcher; an amplification controller for controlling the high-power amplifier and low-power amplifier according to a power level of the input signal; an output impedance matcher for impedance-matching the signal amplified by the high-power amplifier and low-power amplifier; and a dynamic voltage supplier for supplying the low-power amplifier with a variable driving voltage.

Here, the power amplifier may further comprise a first amplifier for amplifying the signal matched by the input impedance matcher, and a middle-stage impedance matcher for impedance-matching the signal amplified by the first amplifier and sending the impedance matched signal to the high-power and low-power amplifiers.

The high-power amplifier may operate in a high-power mode for a highest power consumption range, and the low-power amplifier may operate in a low-power mode for a most frequently used range.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Hereinafter, exemplary embodiments of the present invention will be described in detail. However, the present invention is not limited to the exemplary embodiments disclosed below, but can be implemented in various modified forms. Therefore, the present exemplary embodiment is provided for complete disclosure of the present invention and to fully inform the scope of the present invention to those of ordinary skill in the art.

Figure 1:
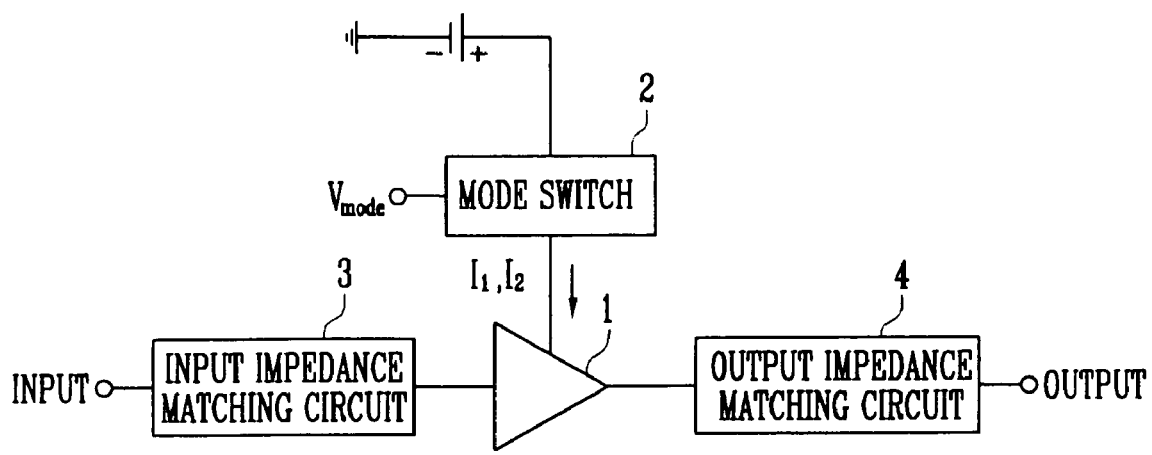
FIG. 1 is a schematic block diagram illustrating a conventional power amplifier.
Figure 2:
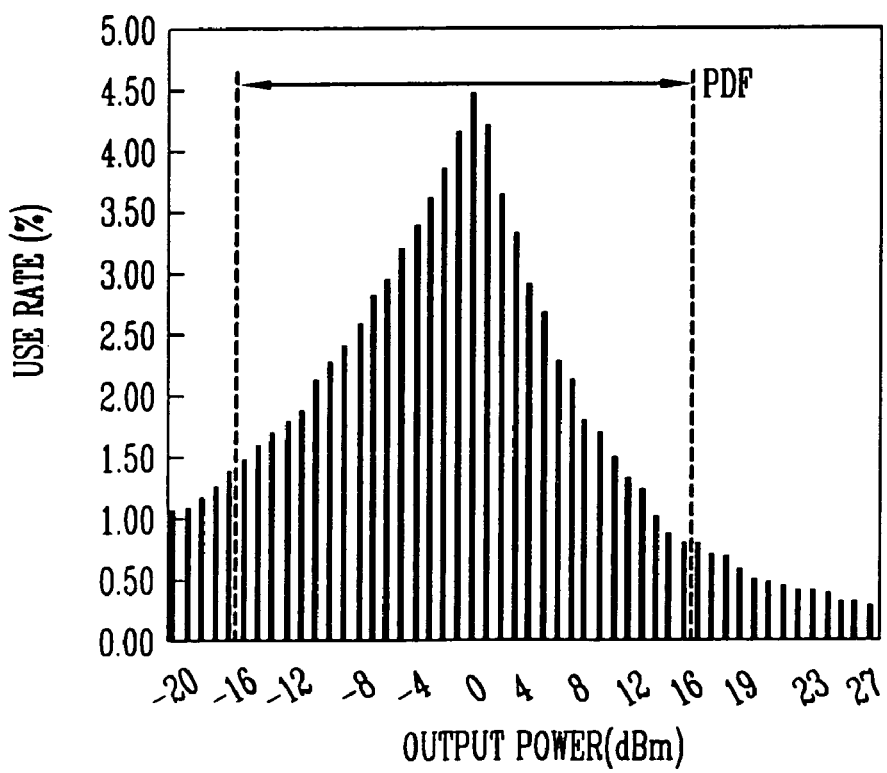
FIG. 2 is a graph showing Conexant company's use rate function according to output power.
Figure 3:
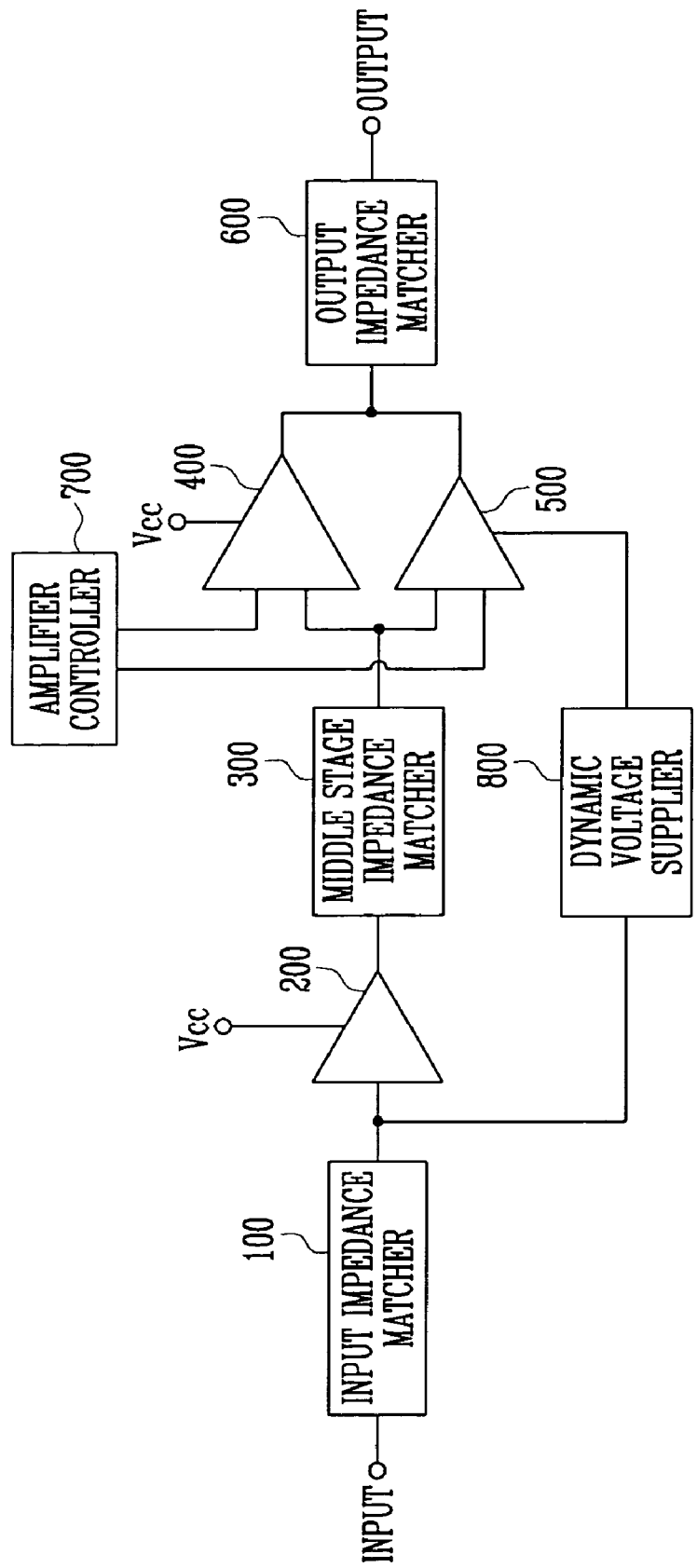
FIG. 3 is a block diagram illustrating the overall structure of a power amplifier according to a first exemplary embodiment of the present invention.
Figure 4:
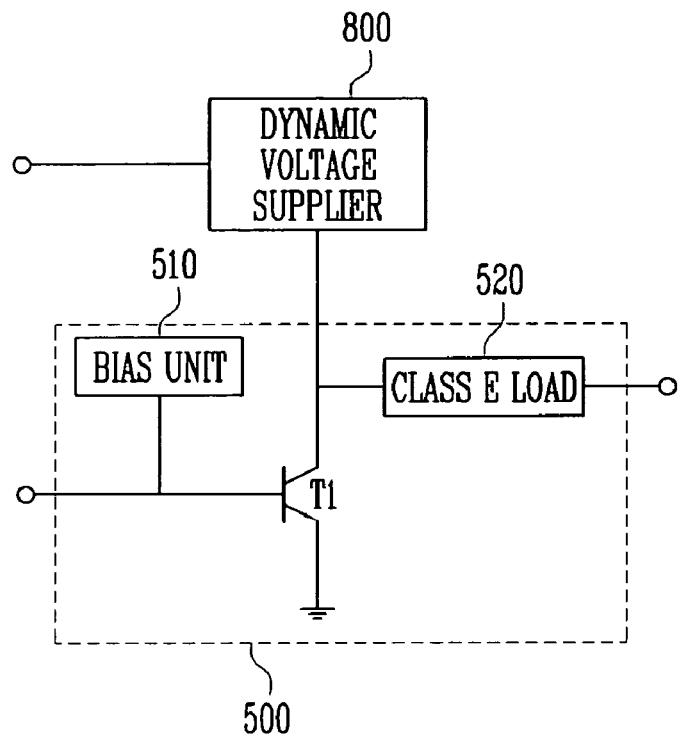
FIG. 4 is a circuit diagram illustrating a third amplifier of FIG. 3 in detail.

FIG. 3 is a block diagram illustrating the overall structure of a power amplifier according to a first exemplary embodiment of the present invention; FIG. 4 is a circuit diagram illustrating a third amplifier of FIG. 3 in detail; and FIG. 5 is a circuit diagram illustrating a dynamic voltage supplier of FIG. 3 in detail.

Figure 5:
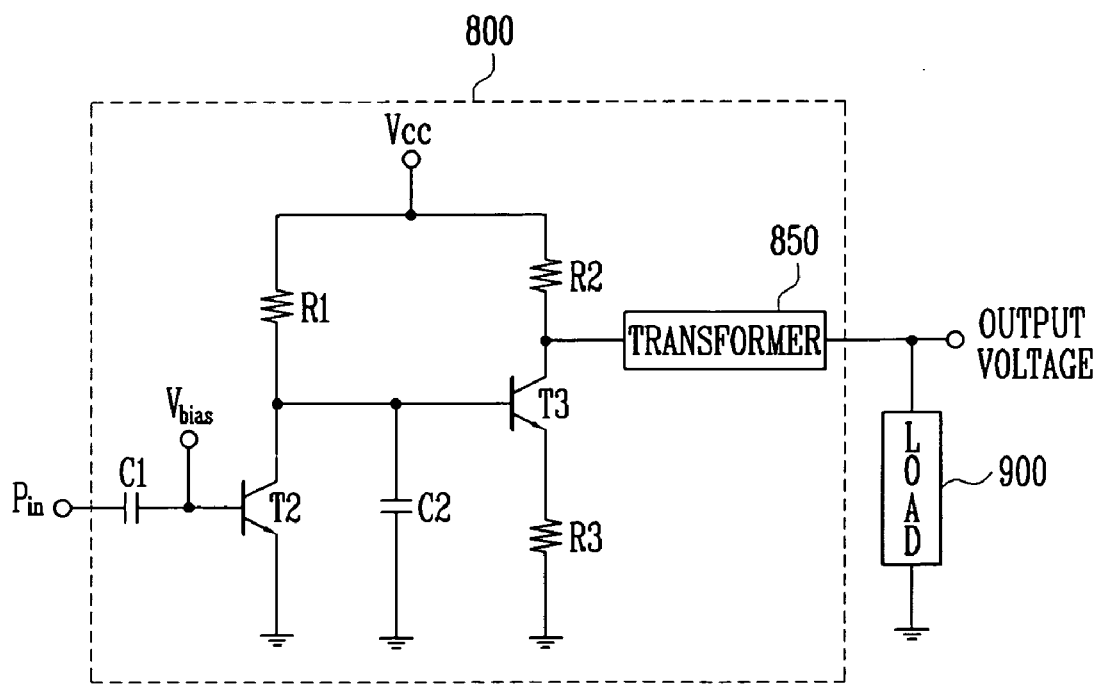
FIG. 5 is a circuit diagram illustrating a dynamic voltage supplier of FIG. 3 in detail.

Referring to FIGS. 3 to 5, the high-efficiency mixed-mode power amplifier according to the first exemplary embodiment of the present invention comprises an input impedance matcher 100, a first amplifier 200, a middle stage impedance matcher 300, a high-power amplifier 400, a low-power amplifier 500, an output impedance matcher 600, an amplifier controller 700, and a dynamic voltage supplier 800.

Here, the input impedance matcher 100 impedance-matches a radio frequency (RF) signal input from the outside and outputs the impedance-matched signal.

The first amplifier 200 receives and amplifies the signal output from the input impedance matcher 100.

The middle stage impedance matcher 300 receives the amplified signal from the first amplifier 200, and properly impedance-matches and outputs the signal.

The high-power amplifier 400 is a high-linearity amplifier, operates according to control of the amplifier controller 700 in a high-power mode and in a highest power consumption range, and receives and amplifies the signal output from the middle stage impedance matcher 300.

Preferably, the size of the high-power amplifier 400 is larger than that of the first amplifier 200 and the low-power amplifier 500.

The low-power amplifier 500 is a non-linear amplifier, operates according to control of the amplifier controller 700 in a low-power mode and in a most frequently used range, is connected with the high-power amplifier 400 in parallel, and receives and amplifies the signal output from the middle stage impedance matcher 300.

As illustrated in FIG. 4, the low-power amplifier 500 is, for example, a class E amplifier, and includes a bias unit 510, a first transistor T1, and a class E load 520 in order to obtain a high-efficiency characteristic. The bias unit 510 is connected to the output terminal of the amplifier controller 700, and turns the low-power amplifier 500 on and off. The first transistor T1 operates according to a control signal of the amplifier controller 700. The class E load 520 is connected between the collector of the first transistor T1 and the input terminal of the output impedance matcher 600, and inputs the RF signal to the output impedance matcher 600.

Here, the collector of the first transistor T1 is connected to the dynamic voltage supplier 800, and the emitter of the first transistor T1 is grounded.

The output impedance matcher 600 impedance-matches the signal amplified by the high-power amplifier 400 or the low-power amplifier 500, and outputs the optimized signal.

The amplifier controller 700 controls the high-power amplifier 400 and low-power amplifier 500 by transferring the digital signal according to the high-power mode or low-power mode, applying a general digital-signal control technique.

To be specific, the amplifier controller 700 generates the predetermined power control signal on the basis of an antenna output signal from the outside. And then, when the amplifier controller 700 operates in the high-power mode, it controls the low-power amplifier 500 to be turned off so as not to operate and controls only the high-power amplifier 400 to be turned on so as to operate. On the other hand, when the amplifier controller 700 operates in the low-power mode, it controls the high-power amplifier 400 to be turned off and only the low-power amplifier 500 to be turned on so as to operate.

Therefore, in the high-power mode and in the highest power consumption range that outputs the maximum power, a desired power can be obtained while maintaining linearity. In addition, in the low-power mode and in the most frequently used range, the length of time that a portable communication terminal or cellular phone battery lasts can be effectively extended by increasing efficiency.

The dynamic voltage supplier 800 is connected between the input impedance matcher 100 and the first amplifier 200 and supplies the low-power amplifier 500 with voltage in the low-power mode and in the most frequently used range. In other words, the low-power amplifier 500 is driven by the dynamic voltage supplier 800. In addition, the same effect can be obtained even if the dynamic voltage supplier 800 is connected to any point ahead of the high-power and low-power amplifiers 400 and 500 to which the input signal is sent, such as between the first amplifier 200 and the high-power amplifier 400 or between the first amplifier 200 and the low-power amplifier 500 (not shown in FIG. 3). In other words, connected as described above, the dynamic voltage supplier 800 is affected by an input power $P_{in}$, and thus smoothly performs its function.

As illustrated in FIG. 5, the dynamic voltage supplier 800 includes a first capacitor C1, a second transistor T2, a first resistor R1, a second capacitor C2, a third transistor T3, a second resistor R2, a third resistor R3, and a transformer 850. The first capacitor C1 is connected between an input power $P_{in}$ terminal and a bias voltage $V_{bias}$ terminal, and the second transistor T2 operates according to the input power $P_{in}$. The first resistor R1 is connected between the collector of the second transistor T2 and a collector voltage Vcc terminal. The second capacitor C2 is connected between the collector of the second transistor T2 and ground, and the third transistor T3 operates according to a collector potential of the second transistor T2. The second resistor R2 is connected between the collector of the third transistor T3 and the collector voltage Vcc terminal, and the third resistor R3 is connected between the emitter of the third transistor T3 and ground. The transformer 850 is connected between the collector of the third transistor T3 and an output voltage terminal, that is, the low-power amplifier 500. In addition, the transformer 850 is for increasing an impedance, and may further include a predetermined load 900 of which one end is connected between the transformer 850 and the low-power amplifier 500 and the other end is grounded.

Here, the input power $P_{in}$ terminal is connected between the input impedance matcher 100 and the first amplifier 200, the emitter of the second transistor T2 is grounded, and the collector of the second transistor T2 is connected with the base of the third transistor T3.

According to the dynamic voltage supplier 800 that is made up as set forth above, a base voltage of the third transistor T3 is reduced by a current of the second transistor T2, which increases according to the input power $P_{in}$.

Thereupon, when the input power $P_{in}$ becomes greater than a predetermined value, the third transistor T3 is turned off, so that an output voltage is determined by the impedance of the second resistor R2 and the load 900.

In addition, when the load 900 is much larger than the resistance of the second resistor R2, the output voltage becomes almost the same as the collector voltage Vcc. And, all high-frequency elements are removed by the second capacitor C2, which is a bypass capacitor. In result, the output of the dynamic voltage supplier 800 comes to have direct current (DC) elements only.

Meanwhile, a point where the third transistor T3 is affected by the input power $P_{in}$ in the dynamic voltage supplier 800, and the inclination of the DC Output voltage that increases according to the input power $P_{in}$, are preferably determined by the values of the first, second and third resistors R1, R2 and R3 and the emitter dimension of the second transistor T2.

In the mixed-mode power amplifier made up as set forth above according to the first exemplary embodiment of the present invention, first, the RF signal input through the common input impedance matcher 100 is amplified by a predetermined level by the first amplifier 200 while passing along a power control path, is impedance-matched by the middle stage impedance matcher 300, and is output to the high-power and low-power amplifiers 400 and 500 that respectively operate in the high-power and low-power modes.

Figure 6:
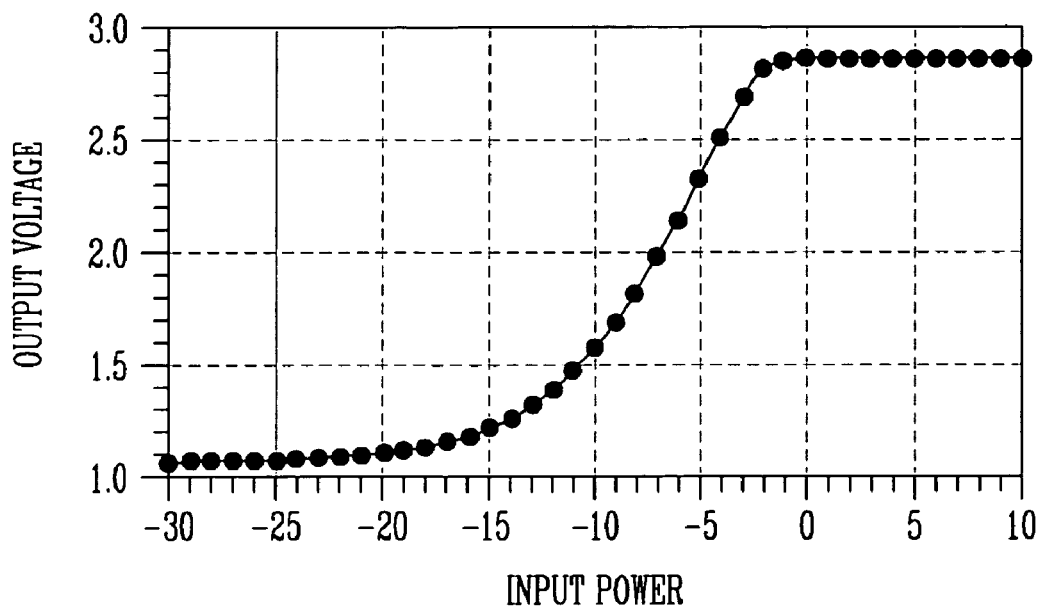
FIG. 6 is a graph of output voltage versus input power of the dynamic voltage supplier shown in FIG. 3.

FIG. 6 is a graph of output voltage versus input power of the dynamic voltage supplier shown in FIG. 3.

When an RF output power is less than an input DC consumption power, a general power amplifier shows very low power efficiency. A power added efficiency (PAE) of the power amplifier is calculated as follows:

$$\text{PAE}(\%) = (\text{output RF power} - \text{input RF power})/\text{input DC power} \times 100.$$

Here, when the input RF power and output RF power are fixed, the efficiency increases as the input DC power decreases. According to the principle described above, in the first exemplary embodiment of the present invention, the high-efficiency mixed-mode power amplifier uses the high-power amplifier 400, which is a high-linearity power amplifier, to obtain high linearity at high power, and uses the low-power amplifier 500, which is a non-linear amplifier, to obtain high efficiency at low power. The efficiency of the power amplifier can be maximized by maintaining the minimum output voltage of the dynamic voltage supplier 800 in the low-power mode.

When the dynamic voltage supplier 800 is not used, a DC voltage is uniformly supplied to the power amplifier regardless of variation of an input voltage, and thus the power amplifier shows a low power added efficiency.

FIG. 6 shows Output voltage versus input power when the driving voltage Vcc of the device is about 3V in the dynamic voltage supplier 800. FIG. 6 indicates that the output voltage is low in the low-power mode, increases as the input power increases, that is, as the power amplifier shifts to the high-power mode, and is fixed after the input power exceeds the predetermined value.

Therefore, since the voltage applied to the low-power amplifier 500 is controlled to be low at the same operating voltage Vcc in the low-power mode in which the input power is low, the input DC power is reduced. Hereupon, the power added efficiency of the low-power amplifier 500 is maximized.

Figure 7:
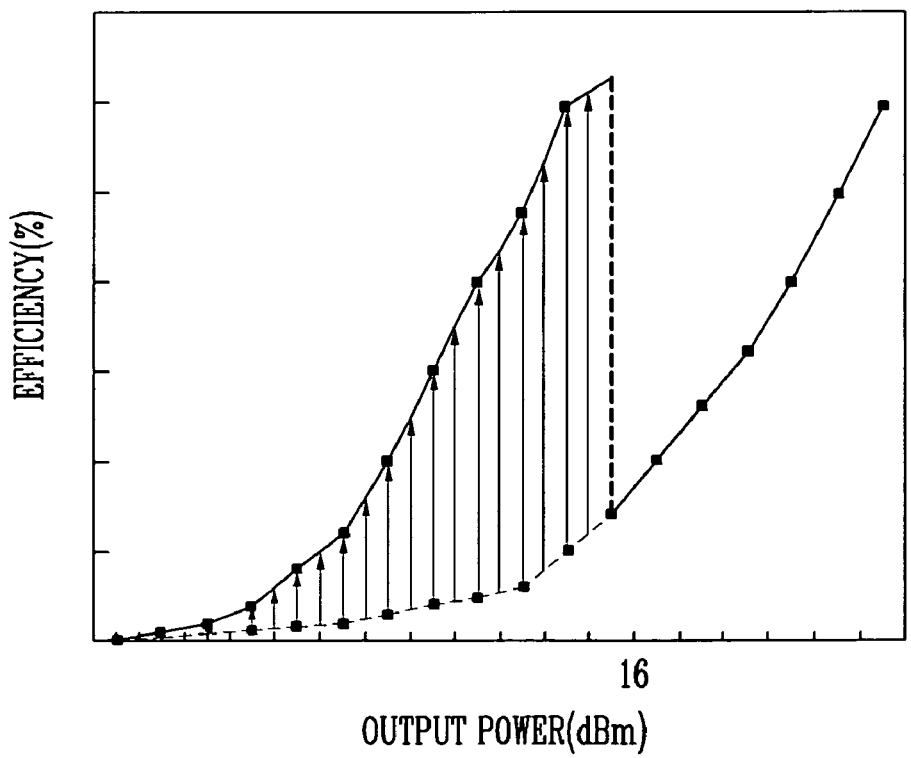
FIG. 7 is a graph of efficiency versus output power of the power amplifier according to the first exemplary embodiment of the present invention.

FIG. 7 is a graph of efficiency versus output power of the power amplifier according to the first exemplary embodiment of the present invention.

Referring to FIG. 7, a linear power amplifier such as a conventional power amplifier (or a large-sized amplifier) shows a low efficiency at an output power of less than 16 dBm, as represented by a dotted line.

However, the first exemplary embodiment of the present invention, represented by a solid line, yields improvement in efficiency in a frequently used output power range due to the influence of the low-power amplifier 500, which is a small-sized non-linear amplifier, and the dynamic voltage supplier 800. In other words, power added efficiency in the low-power mode can be maximized to a level similar to the efficiency corresponding to the peak output power.

Figure 8:
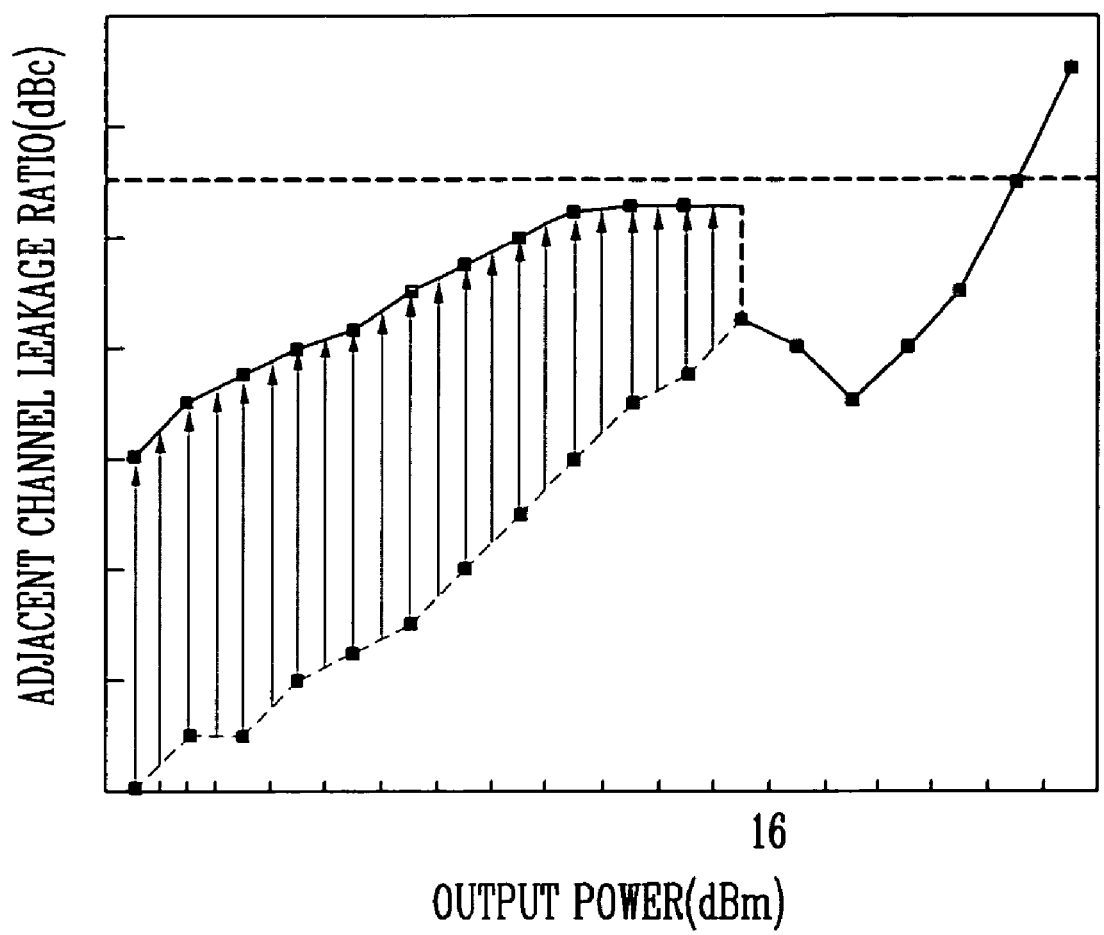
FIG. 8 is a graph of an adjacent channel leakage ratio versus output power of the power amplifier according to the first exemplary embodiment of the present invention.

FIG. 8 is a graph of an adjacent channel leakage ratio versus output power of the power amplifier according to the first exemplary embodiment of the present invention.

Referring to FIG. 8, the adjacent channel leakage ratio is sufficiently far from a standard that there is no need to consider the linearity of the conventional linear amplifier (or a large-sized amplifier) in a low-output-power area.

However, when the first exemplary embodiment of the present invention is used, the linearity seriously deteriorates at an output power of less than 16 dBm due to the low-power amplifier 500, which is a small-sized non-linear amplifier and operates in the low-power mode.

In general, an adjacent channel leakage ratio (ACLR) is an index indicating the linearity of a power amplifier, and is defined as the linearity standard of a power amplifier in a wideband code division multiple access (W-CDMA) method. As illustrated in FIG. 8, in the high-power mode, an ACLR standard is satisfied using the high-power amplifier 400, which is a large-sized linear amplifier. In the low-power mode, the ACLR increases due to the low-power amplifier 500, which is a small-sized, non-linear amplifier, but is restricted to less than required by the standard, so that linearity can be maintained.

Figure 9:
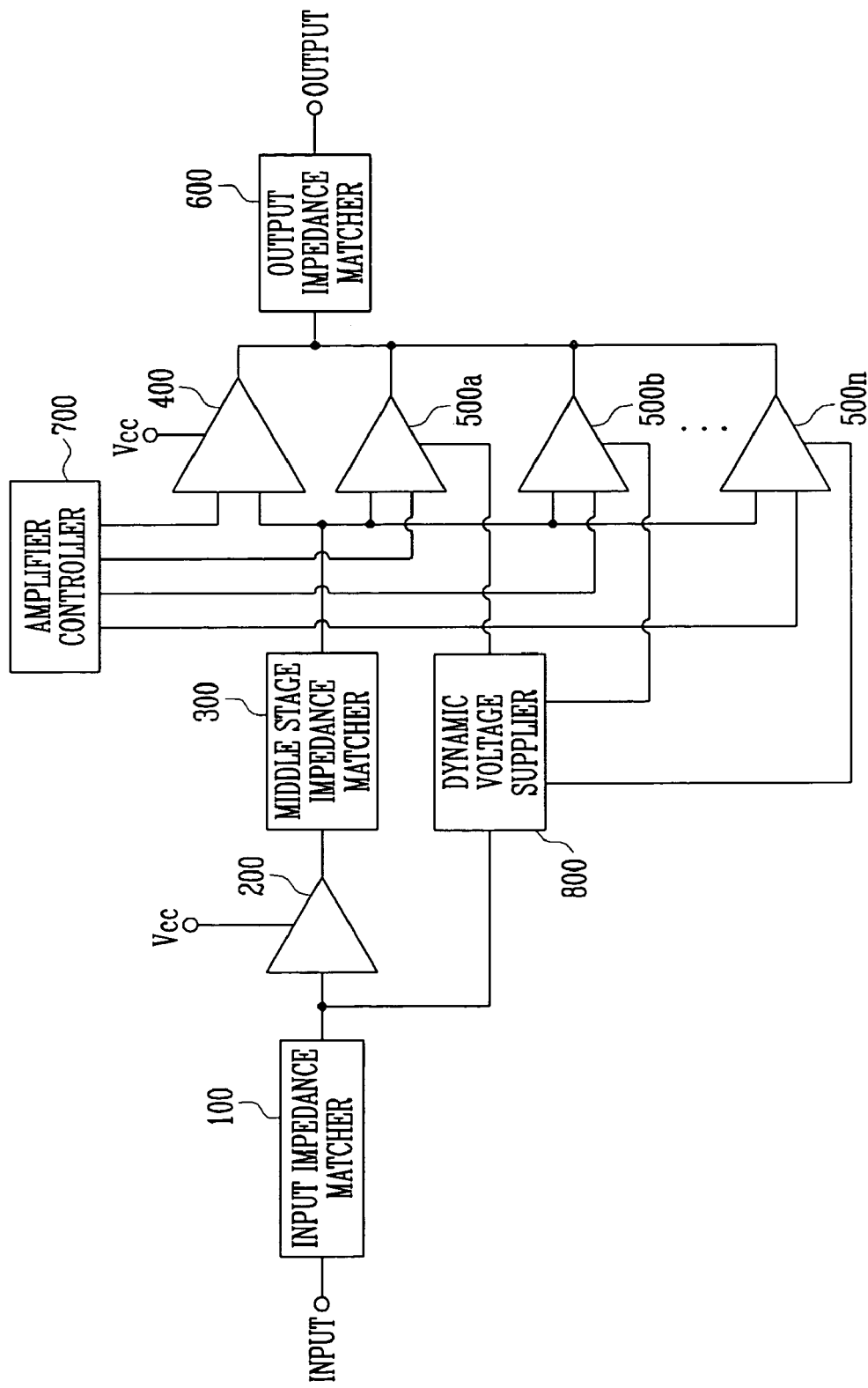
FIG. 9 is a block diagram illustrating the overall structure of a power amplifier according to a second exemplary embodiment of the present invention.

FIG. 9 is a block diagram illustrating the overall structure of a power amplifier according to a second exemplary embodiment of the present invention.

Referring to FIG. 9, the power amplifier according to the second exemplary embodiment of the present invention has a constitution similar to the first exemplary embodiment. Therefore, many aspects of the second exemplary embodiment can be understood by referring to the first exemplary embodiment.

The power amplifier according to the second exemplary embodiment of the present invention is different from the power amplifier according to the first exemplary embodiment in that it comprises a plurality of low-power amplifiers 500*a* to 500*n* connected in parallel.

As mentioned above, the power amplifier according to the second exemplary embodiment of the present invention has a plurality of low-power amplifiers 500*a* to 500*n* connected in parallel, and thereby secures a plurality of optimization points at which maximum efficiency is obtained. Therefore, the efficiency of the power amplifier is maximized, thus enabling a mobile communication terminal/cellular phone battery to last longer.

While the invention has been shown and described with reference to certain exemplary embodiments thereof, it will be understood by those skilled in the art that various changes in form and details may be made therein without departing from the spirit and scope of the invention as defined by the appended claims.

For example, while an embodiment of the power amplifier in which the first amplifier and the low-power amplifier are bipolar transistors is illustrated for easy understanding, the first and low-power amplifiers can be one or a combination of a heterojunction bipolar transistor (HBT) array, a bipolar junction transistor (BJT) array, and a field effect transistor (FET) array.

In addition, in FIG. 3 and the description thereof, an input impedance matching block corresponding to an input impedance matching circuit according to conventional technology includes the input impedance matcher 100, one first amplifier 200, and the middle stage impedance matcher 300. However, for example, when an entire signal amplification degree needs be low, the first amplifier 200 and the middle stage impedance matcher 300 can be removed. Also, when a higher entire signal amplification degree is required, the first amplifier 200 can be a cascaded amplifier made up of a plurality of amplifier devices.

According to the power amplifier of the present invention described above, a power stage is divided into at least two, and a non-linear amplifier is used for high efficiency at a low power while a high-linearity amplifier is used for linearity at a high power. In addition, a dynamic voltage supplier is included to maximize efficiency improvement in a most frequently used range, thus enabling a battery to last longer.

In addition, according to the present invention, a plurality of small-size non-linear amplifiers connected in parallel are included, and thus a plurality of optimization points exhibiting maximum efficiency are secured. Therefore, the efficiency of the power amplifier is maximized, and thus the available battery time of a mobile communication terminal/cellular phone can be extended.

What is claimed is:

1. A power amplifier comprising:
   an input impedance matcher for impedance-matching a signal input from an outside;
   a high-power amplifier and a low-power amplifier for amplifying the signal having passed through the input impedance matcher;
   an amplification controller for controlling the high-power amplifier and the low-power amplifier according to a power level of an input signal;
   an output impedance matcher for impedance-matching the signal amplified by the high-power amplifier and low-power amplifier; and
   a dynamic voltage supplier for supplying the low-power amplifier with a variable driving voltage.

2. The power amplifier according to claim 1, wherein the high-power amplifier operates in a high-power mode for a highest power consumption range, and the low-power amplifier operates in a low-power mode for a most frequently used range.

3. The power amplifier according to claim 1, wherein the high-power amplifier has a characteristic of high linearity, and the low-power amplifier shows high efficiency in a most frequently used range and has a characteristic of non-linearity.

4. The power amplifier according to claim 1, wherein the high-power amplifier and the low-power amplifier alternatively operate according to a power level of an output signal.

5. The power amplifier according to claim 1, wherein the dynamic voltage supplier outputs the variable driving voltage corresponding to the power level of the input signal.

6. The power amplifier according to claim 1, wherein the dynamic voltage supplier has an input terminal connected to one point that is in a transmission path of the input signal and is ahead of the high-power amplifier and the low-power amplifier, and has an output terminal connected to the driving voltage terminal of the low-power amplifier.

7. The power amplifier according to claim 1, wherein the dynamic voltage supplier includes:
   a voltage detection transistor circuit having at least one transistor device and at least one resistor to generate the voltage according to the input power; and
   a high-frequency interception device for preventing high-frequency elements of the input power from being delivered in an output voltage.

8. The power amplifier according to claim 1, wherein the low-power amplifier includes a plurality of amplification devices respectively having different high-efficiency operation ranges at the power level of the input signal.

9. The power amplifier according to claim 1, wherein the high-power amplifier and the low-power amplifier include one of a heterojunction bipolar transistor (HBT) array, a bipolar junction transistor (BJT) array, and a field effect transistor (FET) array.

* * * * *